(12) United States Patent
Rebholz-Goldmann et al.

(10) Patent No.: US 11,940,467 B2
(45) Date of Patent: Mar. 26, 2024

(54) SENSOR ARRANGEMENT

(71) Applicant: Robert Bosch GmbH, Stuttgart (DE)

(72) Inventors: Peter Rebholz-Goldmann, Yokohama (JP); Oda Limbach, Stuttgart (DE); Sven Plecko, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 826 days.

(21) Appl. No.: 17/041,112

(22) PCT Filed: Mar. 14, 2019

(86) PCT No.: PCT/EP2019/056517
§ 371 (c)(1),
(2) Date: Sep. 24, 2020

(87) PCT Pub. No.: WO2019/185368
PCT Pub. Date: Oct. 3, 2019

(65) Prior Publication Data
US 2021/0114567 A1 Apr. 22, 2021

(30) Foreign Application Priority Data

Mar. 27, 2018 (DE) ...................... 10 2018 204 598.4

(51) Int. Cl.
*G01R 1/20* (2006.01)
*B60T 8/171* (2006.01)
(Continued)

(52) U.S. Cl.
CPC ............. *G01R 1/206* (2013.01); *G01R 1/067* (2013.01); *G01R 19/0046* (2013.01);
(Continued)

(58) Field of Classification Search
CPC .... G01R 1/206; G01R 1/067; G01R 19/0046; B60T 8/171; B60T 17/221;
(Continued)

(56) References Cited

U.S. PATENT DOCUMENTS

2005/0288843 A1    12/2005    Lindqvist
2009/0210171 A1    8/2009     Fu
(Continued)

FOREIGN PATENT DOCUMENTS

DE        198 54 304 A1      5/2000
DE    10 2008 009 652 A1    8/2009
(Continued)

OTHER PUBLICATIONS

International Search Report corresponding to PCT Application No. PCT/EP2019/056517, dated Jun. 27, 2019 (German and English language document) (6 pages).

*Primary Examiner* — Michael C Zarroli
(74) *Attorney, Agent, or Firm* — Maginot, Moore & Beck LLP

(57) ABSTRACT

A sensor arrangement includes at least one sensor which is connected to a first control unit and a second control unit. The at least one sensor has two sensor connections, and each of the sensor connections of the at least one sensor is electrically connected to an assigned node. Each node is respectively connected downstream of a control unit input of the first control unit and respectively connected upstream of a control unit input of the second control unit.

14 Claims, 3 Drawing Sheets

(51) Int. Cl.
*B60T 8/88*        (2006.01)
*G01R 1/067*     (2006.01)
*G01R 19/00*     (2006.01)
*B60T 17/22*      (2006.01)

(52) U.S. Cl.
CPC ............... *B60T 8/171* (2013.01); *B60T 8/885* (2013.01); *B60T 17/221* (2013.01); *B60T 2270/403* (2013.01); *B60T 2270/413* (2013.01)

(58) Field of Classification Search
CPC ......... B60T 2270/403; B60T 2270/413; B60T 2270/416; G01P 3/481; G01D 3/08; G08C 25/00; G08C 19/02
See application file for complete search history.

(56) References Cited

U.S. PATENT DOCUMENTS

2015/0253152 A1    9/2015  Grossmann et al.
2019/0222259 A1*  7/2019  Mazumder ............. H04B 3/542

FOREIGN PATENT DOCUMENTS

| DE | 10 2012 218 274 A1 | 4/2014 |
| DE | 10 2014 208 391 A1 | 11/2015 |
| DE | 10 2014 223 895 A1 | 5/2016 |
| DE | 10 2015 202 335 A1 | 8/2016 |
| DE | 10 2017 209 721 A1 | 10/2018 |
| JP | 2004-161086 A | 6/2004 |
| JP | 2007-151272 A | 6/2007 |

* cited by examiner

SENSOR ARRANGEMENT

This application is a 35 U.S.C. § 371 National Stage Application of PCT/EP2019/056517, filed on Mar. 14, 2019, which claims the benefit of priority to Serial No. DE 10 2018 204 598.4, filed on Mar. 27, 2018 in Germany, the disclosures of which are incorporated herein by reference in their entirety.

BACKGROUND

Patent application DE 10 2015 202 335 A1 discloses a first sensor element, by means of which at least one first sensor variable with respect to a speed and/or a rotational speed of the wheel can be provided to at least one evaluation device and/or control system of the vehicle, and an additional second sensor element, wherein at least one second sensor variable with respect to the speed and/or the rotational speed of the same wheel can be provided to the at least one evaluation device and/or control system by means of the second sensor element.

DE 10 20 14 208 391 A1 relates to a device for operating a vehicle, comprising a coupling device which is designed to disconnect a speed sensor from a primary energy supply of a primary control of a primary brake control system and to couple it to a secondary energy supply and sensing. Furthermore, a control apparatus is disclosed which is designed to control the coupling device depending on an error signal from the primary control, such that in the event of an error in the primary control, the speed sensor can be disconnected from the primary energy supply and can be coupled to the secondary energy supply.

SUMMARY

The sensor arrangement according to the disclosure comprises at least one sensor which is connected to two control units. The sensor has two sensor connections, wherein each of the sensor connections of the sensor is electrically connected to an associated node. Each node is connected downstream of a control unit input of the first control unit in each case and is connected upstream of a control unit input of the second control unit in each case. This advantageously enables a signal routing not only to the first control unit but at the same time enables a signal routing to the second control unit, which increases the signal availability in different control units and thus increases redundancy.

In a configuration of the sensor arrangement, the respective node is part of a loop within the first control unit, which loop connects the respective control unit input to a control unit output of the first control unit. A signal which enters the first control unit can thus advantageously be supplied to an output again via the loop.

In a development of the sensor arrangement, the respective control unit output of the first control unit is connected to a corresponding control unit input of the second control unit, in particular via electrical wires. By providing a connection from the first control unit to the second control unit, a sensor signal can, on the one hand, be processed in the first control unit and, on the other hand, can also be made available to the second control unit. This increases safety, for example in a vehicle, since a sensor signal can be evaluated in more than one control unit.

In a configuration of the sensor arrangement, the first and second control unit each have a supply path and a ground path. The supply path in each case extends from a first control unit input to a supply and the ground path extends from a second control unit input to a ground connection. Each of the two control units thus has an input to ground as well as an input to the supply.

In a further configuration of the sensor arrangement, electrical wires in each case connect the ground paths of the first and second control unit as well as the supply paths of the first and second control unit to one another. Since the nodes are connected to the electrical wires which connect the respective control units, the sensor can not only be operated by the first control unit via the nodes, but can also be operated—with the aid of the electrical wires—by the second control unit.

In a configuration of the sensor arrangement, a first switch is provided within the ground path of the first and second control unit respectively, which switch connects the respective control unit inputs to ground in an interruptible manner. The provision of these switches for interrupting the connection to the ground connection makes it possible to completely connect or disconnect the sensor connection to or from a ground of the first or second control unit. This ensures the integrity of the signal which comes from the sensor, because the sensor is not proportionately attached to two ground points of the first and second control unit.

Furthermore, the respective ground path the of the first and second control unit has a measuring element and a second switch. The provision of a measuring element in each control unit ensures that the sensor signal is measured on both sides.

The first switch is connected upstream of the measuring element which, in turn, is connected upstream of the second switch.

One advantageous development of the sensor arrangement involves a third switch being provided within the supply path of the control units respectively, which switch connects the respective control unit inputs to the supply in an interruptible manner. This has the advantage that the supply of one of the control units can be completely separated from the sensor, for example if the other control unit is to take over operation of the sensor. This makes it possible to avoid dual operation of the sensor by two control units at the same time.

In a further configuration of the sensor arrangement, a fourth switch is provided between a supply and the third switch.

The measuring element, the second switch and the fourth switch are advantageously part of a common electronic component, in particular an ASIC.

It is further advantageous that, in the sensor arrangement, the first and the second control unit are coupled via a data connection. This enables communication between the control units, in order to transfer the sensor from one control unit to the second control unit, for example. For this purpose, a respective operating state of the first and second control unit can advantageously be exchanged by means of the data connection, and then, depending on the operating state of the control units, the sensor can either be connected to the first control unit or to the second control unit by correspondingly switching the first and third switches of both control units.

Furthermore, the sensor arrangement can be configured in such a way that a fifth switch is provided within the respective loop, which switch is provided between the respective node within the first control unit and the respective control unit output. The electrical wires can be separated from the respective node by means of this switch. This makes it possible to disconnect wires, which could negatively affect the measurement of the sensor signal in an electromagnetic manner, by means of the fifth switch. Said wires therefore can no longer, rather like antennae, gather disruptive influences or even pass on disruptive influences to other units.

DETAILED DESCRIPTION

The disclosure is described hereinafter by means of two control units 2,4 of a brake system, wherein, however, it is not absolutely necessary for the control units to be used in a brake system.

Figure 1:
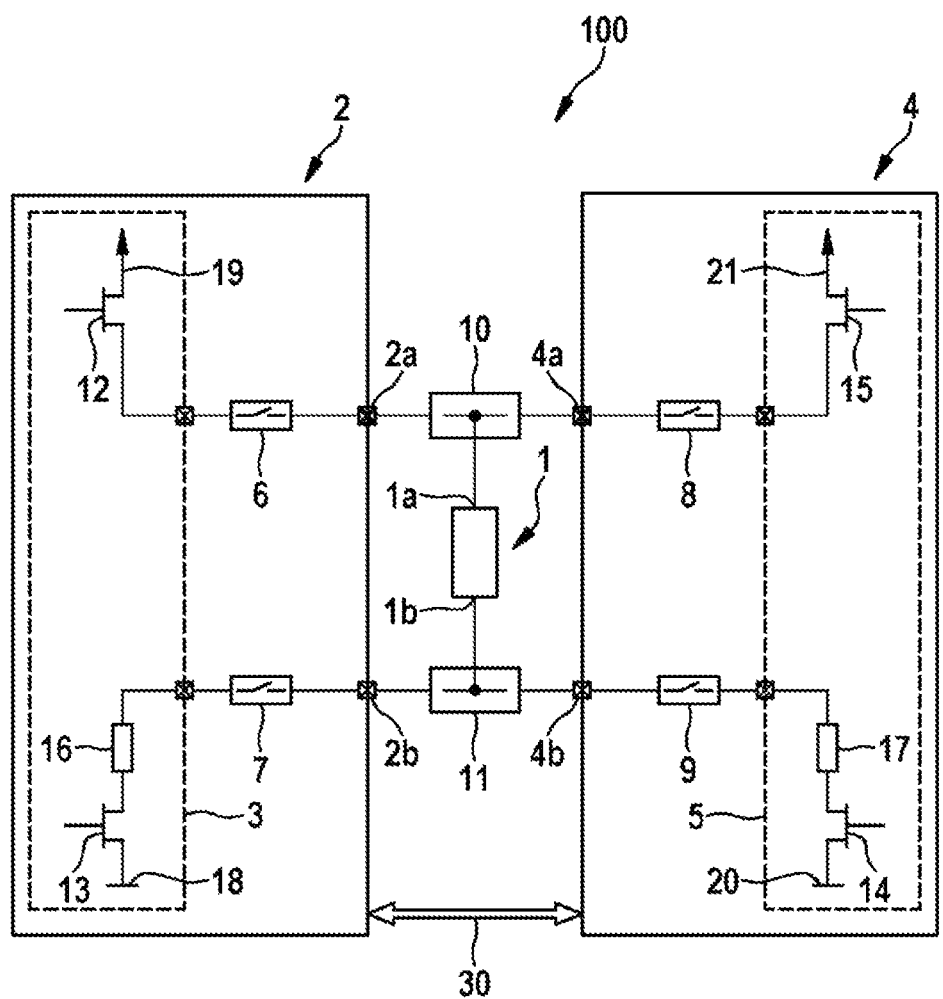
FIG. 1 schematically shows a depiction of a topology of a system comprising two control units, data connections as well as an associated sensor.

FIG. 1 shows two control units 2, 4 of a brake system.

The first control unit 2 is associated with a controllable brake booster. The brake booster is not shown in FIG. 1. A controllable brake booster can be understood as an electro-mechanical, electrohydraulic or also as an electrically controllable vacuum brake booster.

The second control unit 4 is a control unit of a hydraulic power pack, for example of an ESP hydraulic power pack. In this case, the ESP hydraulic power pack comprises a facility for pressurizing wheel brake cylinders of a vehicle, for example by means of a hydraulic pump or a plunger. Conversely, the control unit 2 can also be associated with an ESP and the second control unit 4 with a brake booster.

Both the controllable brake booster and the hydraulic power pack have the ability to cause a build-up of pressure on wheel brake cylinders of a motor vehicle, which wheel brake cylinders are not shown, in a hydraulic manner. In this case, the build-up of pressure can take place in a manner which is dependent on the driver or also independent of the driver. A build-up of pressure which is dependent on the driver results from a driver specification, for example by means of a brake pedal or a brake lever. A build-up of pressure which is independent of the driver is understood to mean an autonomous build-up of pressure which is traced back to control signals which are transmitted to brake boosters and/or hydraulic power packs within the context of emergency braking or an ACC (automated cruise control) regulation. A build-up of pressure which is independent of the driver can also be necessary in the context of highly automated driving and/or semi-automated driving. The build-up of pressure on the part of a brake booster and hydraulic power pack can in particular take place on the same wheel brake cylinders. In this way, brake pressure can be built up on a wheel brake cylinder both on the part of the brake booster and on the part of the hydraulic power pack. In particular, the brake booster can be connected in series upstream of the hydraulic power pack with a main brake cylinder in a hydraulic manner. As a result, a build-up of brake pressure can be undertaken by two different actuators (a brake booster and a hydraulic power pack) in a redundant manner.

The brake system further has at least one sensor 1 on each wheel, for example in the form of a wheel speed sensor 1, which has the ability to detect the rotational speed of the wheel. In this case, different measuring principles can be applied, for example sensors based, on GMR, TMR, AMR technology, or even sensors based on the Hall effect.

In FIG. 1, the sensor 1, for example a speed sensor 1, has two connections 1a and 1b for signal lines. The connection 1a is connected to a first node 10, the connection 1b to a second node 11. The nodes 10 and 11 are each connected to an input 2a, 2b of the first control unit 2 as well as 4a, 4b of the second control unit 4. The connection 1a of the speed sensor 1 is connected to the input 2a of the control unit 2 via the node 10. The connection 1b of the speed sensor 1 is also connected to the input 2b of the control unit 2 via the node 11.

The connection 1a of the sensor 1 is connected to the input 4a of the control unit 4 via the node 10. The connection 1b of the sensor 1 is also connected to the input 4b of the control unit 4 via the node 11.

The signal sequence within the control unit 2 is described hereinafter taking into account the sensor 1.

The control unit 2 has a ground connection 18, also intended to be understood as a ground or sensor signal path. From there, an electrical connection leads to a transistor 13, for example a MOSFET. In this case, the transistor 13 can also be understood as a switch 13.

This transistor 13 is connected to a measuring element 16. A measuring element 16 of this type can be a resistor or a current mirror. A transistor 13 and measuring element 16 can be part of an ASIC 3 within the control unit 2. From the measuring element 16, the connection then leads to a switch 7. The switch 7 can interrupt the connection from the measuring element 16 to the input 2b of the control unit. As already mentioned, the sensor connection 1b is connected to the input 2b of the control unit. The connection of the sensor 1 to the ground connection 18 of the control unit 2 can thus be produced or interrupted by means of the switch 7.

The electrical connection extends from the input 2b of the control unit 2 to the sensor connection 1b via the second node 11. The sensor 1 then guides the electrical connection starting from the first sensor connection 1a to the input 2a of the control unit 2 via the node 10. The input 2a of the control unit 2 is reconnected to a switch 6. The switch 6 connects the input 2a to a transistor 12 which, in turn, is connected to a current source and/or voltage source, for example to a vehicle electrical system or a vehicle battery, via a connection 19. The electrical connection between a sensor connection 1a and the connection 19 to the voltage source and/or current source can also be produced and/or interrupted by means of the switch 6. The transistor 12 can, in turn, be part of the ASIC 3.

Furthermore, the second control unit 4 has a ground connection 20, also intended to be understood as a ground or sensor signal path. From there, an electrical connection leads to a transistor 14, for example a MOSFET. This transistor is connected to a measuring element 17, for example a resistor or a current mirror. A transistor 14 and a measuring element 17 can be part of an ASIC 5 within the control unit 4. From the measuring element 17, the connection then leads to a switch 9. The switch 9 can interrupt, the connection from the measuring element 17 to the input 4b of the control unit 4. As already mentioned, the sensor connection 1b is connected to the input 4b of the control unit 4. The connection of the sensor 1 to the ground connection 20 of the control unit 4 can thus be produced or interrupted by means of the switch 9.

The electrical connection extends from the input 4b of the control unit 4 to the sensor connection 1b via the second node 11. The sensor 1 then guides the electrical connection starting from the first sensor connection 1a to the input 4a of the control unit 4 via the node 10. The input 4a of the control unit 4 is reconnected to a switch 8. The switch 8 connects the input 4a to a transistor 15 which, in turn, is connected to a current source and/or voltage source, for example to a vehicle electrical system or a vehicle battery, via a connection 21. The electrical connection between a sensor connection 1a and the connection 21 to the voltage source and/or current source can also be produced and/or interrupted by means of the switch 8. The transistor 15 can, in turn, be part of the ASIC 5.

The first control device 2 and the second control device 4 can—as described in the present case—be symmetrical in structure. The sensor 1 which is connected to the control units can either be connected to the first control unit 2 or to the second control device 4 by correspondingly switching, on the one hand, the switches 6 and 7 of the first control device 2 or respectively the switches 8 and 9 of the second control device 4. If the switches 6 and 7 of the first control device 2 are closed and the switches 8 and 9 of the second control unit 4 are open, the sensor 1 is thus connected to the first control device 2.

In contrast, if the switches 6 and 7 are open and the switches 8 and 9 are closed, the sensor 1 is thus connected to the control device 4. A connected sensor 1 can be understood to mean that the sensor 1 is brought into electrical connection with the ASIC of the respective control device by correspondingly closing the switches 6, 7 or 8, 9.

Figure 2:
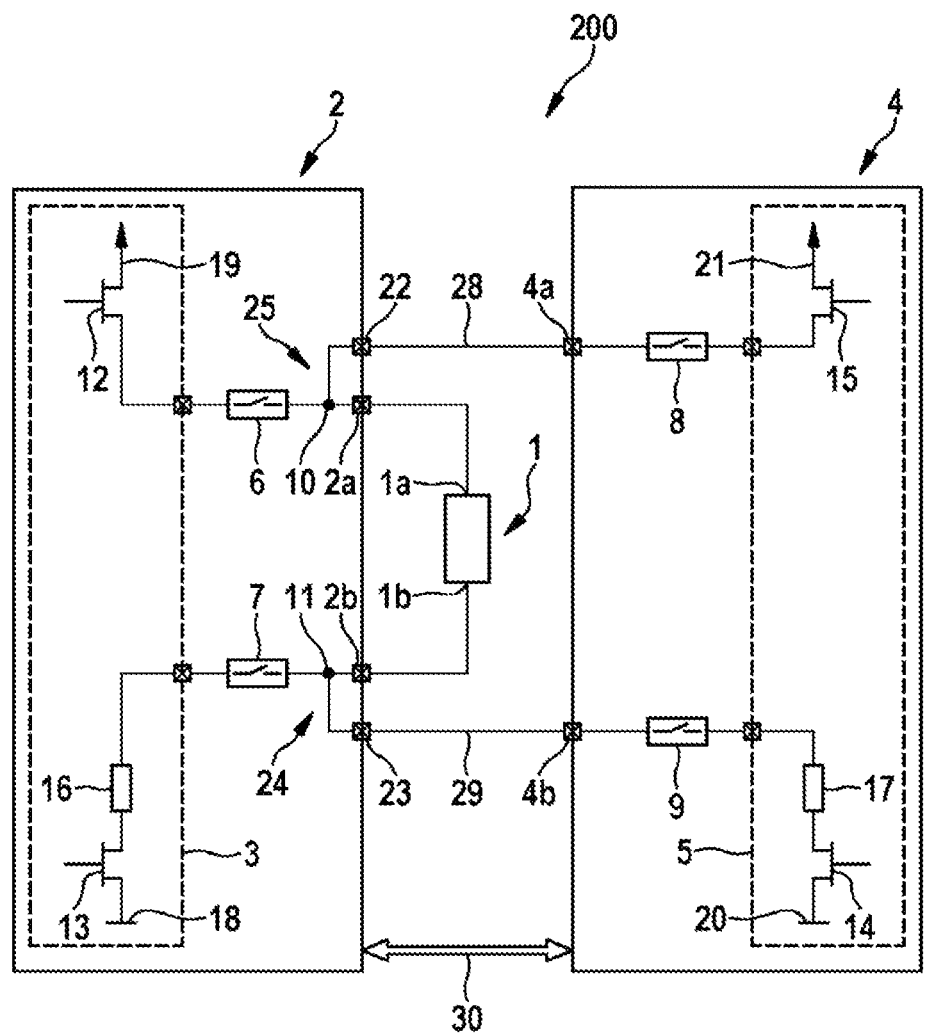
FIG. 2 also schematically shows two control units with an associated sensor in a different connection.

An embodiment is depicted in FIG. 2. Reference numbers have been essentially retained therein. In the control units 2 or 4 respectively, the sections of the ground connection 18, 20 to the switches 7 or 9 respectively and the sections of the switches 6, 7 to the current sources/voltage sources 19, 21 correspond to the corresponding sections of the control units 2, 4 in FIG. 1.

The sensor 1 is reconnected to two nodes 10, 11. The nodes 10, 11 are indeed located within one of the control units 2, 4. In the present case shown, the nodes 10, 11 are located within the control unit 2.

The sensor 1 is connected to an input 2b of the control unit 2 by means of the sensor connection 1b. The input 2b is in connection with a node 11 which connects the input 2b to the switch 7 via a wire. Via a second wire starting from the node 11, it is connected to a control unit output 23. In this way, the sensor connection 1b can be connected to the control unit output 23 via the control unit input 2b and the node 11.

Furthermore, the sensor 1 is connected to an input 2a of the control unit 2 by means of the sensor connection 1a. The input 2a is in connection with a node 10 which connects the input 2a to the switch 6 via a wire. Via a second wire starting from the node 11, it is connected to a control unit output 22. In this way, the sensor connection 1a is connected to the control unit output 22 via the control unit input 2a and the node 10.

The control unit output 22 as well as the control unit output 23 of the control unit 2 is connected to the respective input 4a, 4b of the other control unit 4 via an electrical wire 28, 29.

By providing the node 10 as well as the node 11 within the control unit 2, the sensor 1 is connected in such a way that the signal of the sensor 1 can, on the one hand, be used within the control unit 2 and, on the other hand, is passed through the control unit 2 and is made available to the control unit 4. In other words, the nodes 10, 11 ensure that the sensor signal in the control unit 2 is diverted to the second control unit 4.

Again, in other words, the sensor 1 is directly connected to the first control unit 2, and is indirectly connected to the second control unit 4 via a loop 24, 25. In this case, the first control unit has a loop 24, 25 for the first sensor connection 1a and the second sensor connection 1b respectively. The loops comprise, respectively, the control unit input 2b, the node 11 and the control unit output 23 of the first control unit 2 as a first loop 24, and the second control unit input 2a, the node 10 and the control unit output 22 of the first control unit 2 as a second loop 25.

Similarly to the first embodiment in FIG. 1, the sensor 1 can either be connected to the ASIC 3 of the control unit 2 or to the ASIC 5 of the control unit 4 by means of the switches 6,7, 8,9 of the respective control device 2,4 by switching correspondingly. If the sensor 1 is connected to the control unit 2, and there to the ASIC 3, the switches 6 and 7 must be opened. The switches 8 and 9 must be closed in order to connect the sensor 1 to the ASIC 5 of the control unit 4. The switches 6,7 and 8,9 are responsible for the switching-over. If the switches 6,7 are closed, the switches 12,13 must also be closed for sensor operation in the respective control device 2. In this case, if the switches 8,9 are open, the switch setting of the switches 14,15 is not relevant. The switches 14,15 are then preferably also open.

Since the sensor 1 is a current interface, the two control units 2,4 must not be operated at the same time at the sensor, in particular in the ground path, because in this case the current is distributed indeterminately and a signal detection is no longer guaranteed.

The switches 6,7 and 8,9 which are located outside of the respective ASIC 3,5 should avoid an error in one of the two ASICs 3 or 5 which results in the switches 12,13 or 14,15 closing permanently and thus preventing a switching-over. (Avoiding common cause ASIC).

Figure 3:
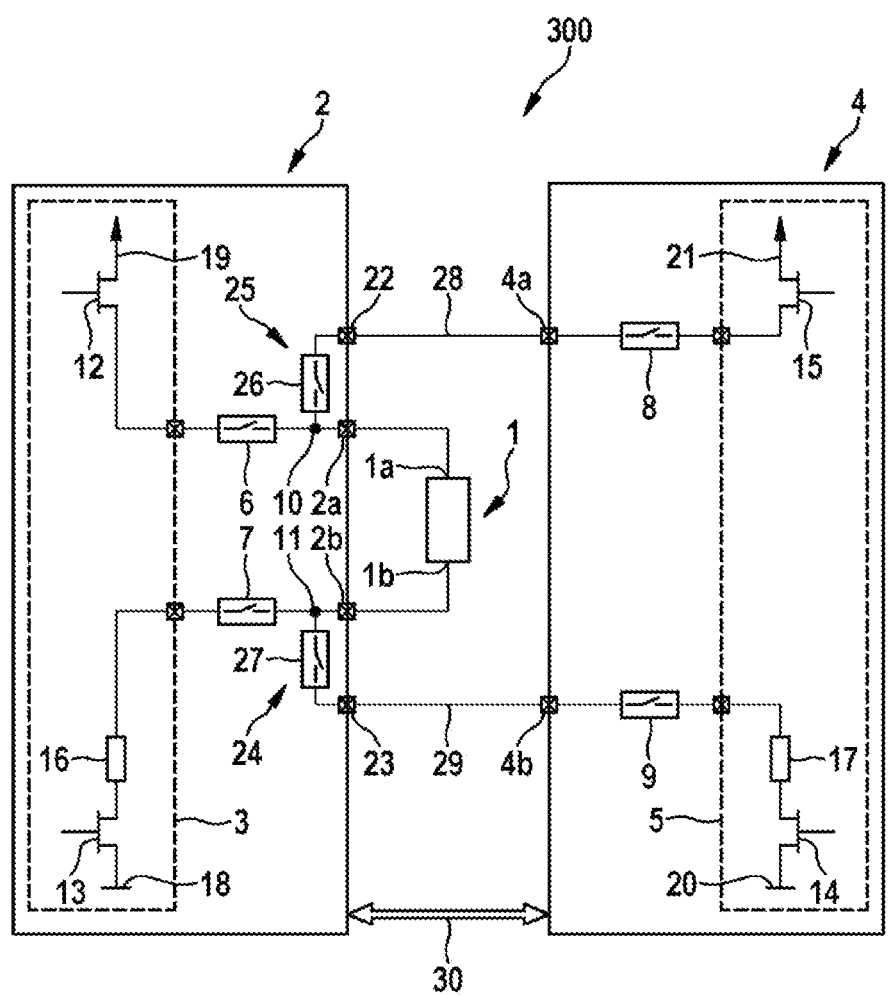
FIG. 3 also schematically shows two control units with an associated sensor in a further connection.

FIG. 3 shows a further embodiment which substantially corresponds to FIG. 2. However, in FIG. 3, another further switch 26,27 is incorporated into the loops 24 and 25, which switch connects the nodes 10, 11 to the respective control unit output 22, 23 in an interruptible manner. In this way, in an operating condition in which the sensor 1 is connected to the control unit 2, i.e. is to be operated with it, the connecting lines 28,29 between the control unit outputs 22, 23 of the first control unit 2 and the control unit inputs 4a, 4b of the second control unit 4 can be disconnected. In this way, the connecting lines 28,29 no longer influence the electrical circuits and connections of the control unit 2, for example, if interferences are captured via the connecting lines 28,29 due to the fact that the connecting lines function as a kind of antenna.

In all three embodiments of FIGS. 1-3, the sensor 1 can be connected to the first control unit 2 or to the second control unit 4. The connection takes place by opening and closing the switches 6,7 of the first control unit 2 or 8,9 respectively of the second control unit 4 which are involved.

The first and second control unit 2,4 is in each case associated with a unit which has the ability to bring about a brake action, controlled by the control unit, in a brake system. Units of this type can exist in the form of a brake booster, a hydraulic power pack (for example an ABS/ESP/TCS) with a hydraulic pressure source, in the form of electromotive brakes, for example drive units which also have the ability to brake dynamically, in the form of parking brakes or drum brakes. In this case, the list is not exhaustive. Brake systems of this type can be based on signals of an associated sensor 1 and cause corresponding brake actions. For this purpose, the sensor can be a speed sensor 1 of a brake system, for example, which is provided on a vehicle wheel and can measure the speed thereof.

A brake system normally comprises 2 brake subsystems which have the ability to produce brake actions in a vehicle separately from one another. If one of these systems fails, for example the brake system associated with the control unit 4, a different system must take over. This can be carried out by the brake subsystem associated with the control unit 2. Due to the fact that the sensor 1 is connected to both control devices 2, 4 and can be switched from one control device to the other in a simple manner, the sensor signals of the sensor 1 can be used by both brake subsystems, in particular of the associated control devices 2, 4. It is, therefore sufficient to provide one individual sensor and to connect it to both control units, instead of having two separate sensors for each control unit.

Furthermore, the control units 2, 4 can be connected to one another via a bus system (for example CAN or Flexray), in order to monitor the respective operating state and optionally to initiate a switching-over of the sensor 1 from one control unit 2, 4 to the respective other control unit 2,4.

In principle, both paths (path of control unit 2 and path of control unit 4) must be tested during initialization.

Within the framework of a safety concept of the control unit connection, the switches 6,7, 8 and 9 as well as, if present, the switches 25/27 must be correspondingly open or closed in the event of a fault in the fallback level of the control unit.

An example would be that the control unit 2 has a fault which results in control no longer being possible. In this case, the switches 6,7 must be open or be opened and—if present in the embodiment in FIG. 3—the switches 26, 27 must be closed, so that the control unit 4 can take over.

The invention claimed is:

1. A sensor arrangement comprising:
   a plurality of nodes; and
   at least one sensor operably connected to a first control unit and a second control unit, the at least one sensor including two sensor connections, and each of the sensor connections electrically connected to an associated node of the plurality of nodes,
   wherein each node of the plurality of nodes is connected downstream of a control unit input of the first control unit in each case, and is connected upstream of a control unit input of the second control unit in each case,
   wherein the associated node is part of a loop within the first control unit, and
   wherein the loop connects a respective control unit input to a control unit output of the first control unit.

2. The sensor arrangement as claimed in claim 1, wherein a respective control unit output of the first control unit is connected to a corresponding control unit input of the second control unit.

3. The sensor arrangement as claimed in claim 2, wherein:
   the first and second control units each have a supply path and a ground path,
   the supply path in each case extends from a first control unit input to a supply, and
   the ground path extends from a second control unit input to a ground connection.

4. The sensor arrangement as claimed in claim 3, wherein electrical wires connect the ground paths of the first and second control units as well as the supply paths of the first and second control units to one another.

5. The sensor arrangement as claimed in claim 4, further comprising:
   a first switch operably connected within the ground path of the first and second control units respectively, the first switch configured to connect the respective control unit inputs to ground in an interruptible manner.

6. The sensor arrangement as claimed in claim 5, wherein a respective ground path of the first and second control units has a measuring element and a second switch.

7. The sensor arrangement as claimed in claim 6, wherein the first switch is connected upstream of the measuring element which, in turn, is connected upstream of the second switch.

8. The sensor arrangement as claimed in claim 6, wherein:
   a third switch is operably connected to the supply path of the first and second control units respectively, and
   the third switch connects the respective control unit inputs to the supply in an interruptible manner.

9. The sensor arrangement as claimed in claim 8, further comprising:
   a fourth switch operably connected between the supply and the third switch.

10. The sensor arrangement as claimed in claim 9, wherein the measuring element, the second switch and the fourth switch are part of a common electronic component.

11. The sensor arrangement as claimed in claim 8, further comprising:
    a data connection configured to couple the first and the second control units.

12. The sensor arrangement as claimed in claim 11, wherein:
    the data connection is configured to exchange a respective operating state of the first and second control units, and
    depending on the operating state of the first and second control units, the sensor is either connected to the first control unit or to the second control unit by switching the first and third switches.

13. The sensor arrangement as claimed in claim 9, further comprising:
    a fifth switch provided within the respective loop, the fifth switch provided between the respective node within the first control unit and the respective control unit output.

14. The sensor arrangement as claimed in claim 13, wherein the electrical wires are separated from the respective node by the fifth switch.

* * * * *